(12) United States Patent
Fujisaki

(10) Patent No.: US 6,173,238 B1
(45) Date of Patent: Jan. 9, 2001

(54) MEMORY TESTING APPARATUS

(75) Inventor: Kenichi Fujisaki, Gyoda (JP)

(73) Assignee: Advantest Corporation, Tokyo (JP)

( * ) Notice: Under 35 U.S.C. 154(b), the term of this patent shall be extended for 0 days.

(21) Appl. No.: 09/051,406

(22) PCT Filed: Aug. 11, 1997

(86) PCT No.: PCT/JP97/02805

§ 371 Date: Sep. 23, 1998

§ 102(e) Date: Sep. 23, 1998

(87) PCT Pub. No.: WO98/07162

PCT Pub. Date: Feb. 19, 1998

(30) Foreign Application Priority Data

Aug. 9, 1996 (JP) .................................................. 8-211585

(51) Int. Cl.[7] .................................................. G11C 7/00
(52) U.S. Cl. ...................... 702/117; 714/719; 365/230.01
(58) Field of Search .................................. 702/117, 118; 714/42, 718, 719; 324/527, 528; 365/230.01, 230.03, 230.09

(56) References Cited

U.S. PATENT DOCUMENTS

| 5,511,029 | * | 4/1996 | Sawada et al. | 365/201 |
| 5,587,950 | * | 12/1996 | Sawada et al. | 365/201 |
| 5,959,930 | * | 9/1999 | Sakurai | 365/230.03 |

FOREIGN PATENT DOCUMENTS 59-211896 11/1984 (JP) .
2-67977 3/1990 (JP) .

* cited by examiner

Primary Examiner—Patrick Assouad
(74) Attorney, Agent, or Firm—Staas & Halsey LLP

(57) ABSTRACT

A failure analysis memory operating at high speed comprises low speed DRAMS. The failure analysis memory comprises a data compression part reducing a number of writing operations of failure data if the same address is repeatedly accessed in close test cycles and if a failure occurs at that address. Use of the failure data compression part results in reduction of the number of writing operations of failure data, and thus decreases the amount of interleaving required of the failure analysis memory. The failure analysis memory, therefore, can be constructed using a reduced number of memory elements.

5 Claims, 14 Drawing Sheets

ROW ADDRESS & ITS NO. OF FAILS

| ADRESS n | TOTAL NO. OF FAILS | ROW ADDRESS | NO. OF FAILS | NO. OF COMPRESS FAILS |
|---|---|---|---|---|
| ±1 | 8 | RAt | 6 | 4 |
| | | RAt-1 | 1 | 1 |
| | | RAt-1 | 1 | 1 |
| ±2 | 16 | RAt | 12 | 8 |
| | | RAt-1 | 1 | 1 |
| | | RAt-1 | 1 | 1 |
| | | RAt-2 | 1 | 1 |
| | | RAt-2 | 1 | 1 |
| ±3 | 24 | RAt | 18 | 12 |
| | | RAt-1 | 1 | 1 |
| | | RAt-1 | 1 | 1 |
| | | RAt-2 | 1 | 1 |
| | | RAt-2 | 1 | 1 |
| | | RAt-3 | 1 | 1 |
| | | RAt-3 | 1 | 1 |

FIG. 8

FAILURE OCCURRING TIME & FAILURE STORING TIME

| ADDRESS | TOTAL TIME OF FAILURE OCCURRENCES | NO. OF FAILUS OF RAt | STORE TIME OF FAILUS OF RAt (6 BANK PARALLEL PROCESSING) | NO. OF COMPRESSED FAILS OF RAt | STORE TIME OF COMPRESSED FAILUS OF RAt (6 BANK PARALLEL PROCESSING) |
|---|---|---|---|---|---|
| ±1 | 80ns | 6 | 100ns | 4 | 67ns |
| ±5 | 400ns | 30 | 500ns | 20 | 340ns |
| ±10 | 800ns | 60 | 1000ns | 40 | 670ns |
| ±50 | 4000ns | 300 | 5000ns | 200 | 3400ns |
| ±100 | 8000ns | 600 | 10000ns | 400 | 6700ns |
| ±500 | 40000ns | 3000 | 50000ns | 2000 | 34000ns |

FIG. 9

BUTTERFLY PATTERN

MEMORY TESTING APPARATUS

BACKGROUND OF THE INVENTION

1. Field of the Invention

The present invention relates to a memory testing apparatus suitable to test a semiconductor memory such as a memory in the form of an integrated circuit (an integrated circuit memory, hereinafter referred to as IC memory), and more particularly, to a failure analysis memory for storing test results of a semiconductor memory.

Description of the Related Arts

FIG. 10 shows a basic construction of a conventional memory testing apparatus of this type. The illustrated memory testing apparatus comprises a timing generator TG, a pattern generator PG, a waveform shaping device FC, a logical comparator DC, and a failure analysis memory FM.

The pattern generator PG generates, in response to a reference clock generated by the timing generator TG and supplied thereto, an address signal, a data signal and a control signal which are to be applied to an IC memory under test (hereinafter referred to simply as memory under test) MUT. These signals are supplied to the waveform shaping device FC where they are shaped to have waveforms required for the test, and thereafter they are applied to the memory under test MUT. A data signal written into the memory under test MUT is read out therefrom later and is supplied to the logical comparator DC where the read-out signal is compared with an expected value data signal supplied from the pattern generator PG to detect whether there is an anti-coincidence or a mismatch between both signals or not. If there is a mismatch therebetween, the memory under test MUT is determined to be a failure memory and if there is not, the memory is determined to be a conformable (good or pass) memory.

When there is a mismatch between both signals, a failure signal (failure data) is outputted from the logical comparator DC to the failure analysis memory FM. This failure data is stored in an address of the failure analysis memory FM specified by an address signal from the pattern generator PG. Normally, when there is not a mismatch therebetween, the logical comparator DC generates a pass signal which is not stored in the failure analysis memory FM.

In such a way, information of the failure addresses of the memory under test MUT associated with the failure memory cells which occurred during a series of tests is stored in the failure analysis memory FM. After all of the tests for the memory under test MUT have been completed, a failure analysis of the memory under test MUT is performed with reference to the failure data stored in the failure analysis memory FM. For example, in case such failure data is utilized for relieving failure memory cells of an MUT, a failure map is created based on the read-out failure data from the failure analysis memory FM to determine whether it is possible or not to relieve the detected failure memory cells by relieving means provided on the memory under test MUT.

The failure analysis memory FM has the same operating speed or rate and storage capacity as those of a memory under test MUT, and the same address signal as that applied to the memory under test MUT is applied to the failure analysis memory FM. In addition, the failure analysis memory FM is initialized before a test starts. For example, the failure analysis memory FM is initialized by writing logical "0" in all of the addresses thereof, and when a failure data is generated from the logical comparator DC during a test of the memory under test MUT, logical "1" is written in an address of the failure analysis memory FM specified by the above address signal.

Conventionally, a high speed static type RAM (SRAM) has been used in a failure analysis memory FM. However, an SRAM is expensive and moreover, there is a tendency in recent years that makers each manufacturing high speed SRAMs have no plan for expanding the storage capacity of an SRAM. Consequently, it is difficult to use a high speed SRAM having large storage capacity in a failure analysis memory in correspondence with increase of storage capacity of a memory under test MUT. Therefore, an attempt to use a dynamic type RAM (DRAM) instead of an SRAM to construct a failure analysis memory has been made. A DRAM is inexpensive, but operates at low speed or rate and needs to periodically undergo a refresh operation (an operation for maintaining the stored contents in the DRAM). Since the operation speed (or rate) of a DRAM is slower than that of an SRAM, the number of interleaving a failure analysis memory (the number of parallel processing) must be increased if the failure analysis memory is designed in which its SRAM is simply replaced by a DRAM.

Here, an interleave operation of a memory will be briefly explained. The interleave operation of a memory is a system in which a plurality of memory blocks each having the same storage capacity are provided and those memory blocks are operated at different timings each shifted by a small amount of time interval from the former, thereby increasing the operating speed (or rate) of the memory as a whole. The number of memory blocks is called the number of interleaves and single memory block is also called a bank of interleave. FIG. 11 shows an example of a circuit construction of a failure analysis memory contemplated in case a DRAM is used therein.

As illustrated, a switching circuit MP and a plurality (N) of memory blocks (banks) BK#1, BK#2, BK#3, ..., BK#N are provided in a failure analysis memory FM (where N is integer equal to or greater than two), and the circuit construction is arranged such that each time a failure data is generated, the switching circuit MP switches the memory blocks BK#1–BK#N in regular sequence to supply the failure data to the corresponding one memory block so that the failure data can be sequentially distributed to and stored in the plurality of memory blocks BK#1, BK#2, BK#3, ..., BK#N.

As can be easily understood from FIG. 12, by employing this interleave structure, each of the memory blocks BK#1–BK#N suffices to operate at a speed (or rate) of 1/N of the operating speed (or rate) of a memory under test MUT. For example, if there are provided four memory blocks (banks) each operating at a cycle of 100 ns (nanoseconds) and those four memory blocks are operated at different timings shifted by 25 ns from the former, the four memory blocks are deemed as a whole to be equivalent to a memory operating at a cycle of 25 ns.

As a consequence of using a DRAM operating at low speed (or rate) and operating the DRAM in the interleave manner, writing of high speed data in the DRAM and reading of the high speed data therefrom is made possible. However, in case the interleave structure shown in FIG. 11 is employed, an address signal at which a failure signal is generated and the failure signal are randomly supplied to each of the memory blocks BK#1–BK#N, and hence each of the memory blocks BK#1–BK#N must have the same memory capacity as that of a memory under test MUT. As a result, when an interleave structure of N blocks (banks) is arranged, a memory capacity having N times as large as that of a memory under test MUT is required and the amount of usage of memory elements is increased in proportion to the number N of interleaves (memory blocks).

Further, there is a test reffered to an interference test between memory cells among memory testing methods. This interference test between memory cells (hereinafter referred to as inter-cell interference test) is a memory testing method wherein a specific memory cell in a memory under test is noted or interested and when memory cells which are considered to interfere in structure with the interested memory cell (hereinafter referred to as memory cell of interest) are accessed, a test is done to check whether the data of the memory cell of interest is broken by such access of each of those memory cells, this test being done by changing in order the memory cell of interest to another one.

FIGS. 13–15 show three examples of a test pattern used in this inter-cell interference test. FIG. 13 shows a test pattern called a galloping pattern, FIG. 14 shows a test pattern called a ping-pong pattern, and FIG. 15 shows a test pattern called a butterfly pattern. In the butterfly pattern shown in FIG. 15, a reference character Tc denotes a memory cell of interest, reference characters A–D denote interfering memory cells respectively, and reference characters 1–8 denote the sequence of accesses.

As shown in FIGS. 13 to 15, in the inter-cell interference test, the same address of the memory cell of interest is accessed many times in close test cycles. In case the memory cell of interest is a failure memory cell, a failure data is generated in every access to the memory cell of interest, and hence the frequency (the number of times) of writing failure data in the failure analysis memory is increased. In order to perform the writing operation of the failure data in the failure analysis memory in accordance with the writing frequency, the number of interleaving the failure analysis memory must be increased. If the number of interleaving is increased, the amount of memory used must be increased, which results in drawbacks that the cost of the failure analysis memory is increased even if inexpensive DRAMs are used and that the physical size of thereof becomes large.

SUMMARY OF THE INVENTION

It is an object of the present invention to provide a memory testing apparatus in which a failure analysis memory can be constituted by a reduced number of memory elements even if the same address of a memory under test is accessed plural times in close test cycles and a failure data is generated from that address as many times by reducing the writing frequency of the failure data.

In the present invention, the above object is attained by providing a memory testing apparatus including a failure analysis memory for storing failure data resulting from a test of a semiconductor memory under test and wherein a plurality of memory elements, each of the plurality of memory elements needing a storage maintaining operation at regular intervals, are used in a memory part of the failure analysis memory and failure data are distributed to and stored in the plurality of memory elements by means of an interleave operation. The failure analysis memory comprises: a clock generating part for generating a clock for operating the memory elements of the memory part, the clock being independently of a reference clock for testing a semiconductor memory under test; means, supplied with an operating clock from the clock generating part, for generating a refresh request signal at regular intervals in order to maintain the stored contents of the memory elements; an address selection part, supplied with the same address signals as those given to the semiconductor memory under test, for taking out among the address signals a row address signal and a column address signal matching with an arrangement of row addresses and column addresses of each of the memory elements; synchronizing means supplied with a row address signal and a column address signal selected by the address selection part and with a failure data from a logical comparator means, and for converting them into a row address signal and a column address signal and a failure data all of which are in synchronism with a clock outputted from the clock generating part; failure data compression means for compressing failure data occurring at the same address in close timings among the row and column address signals and the failure data outputted from the synchronizing means into one failure data; and a data distribution control part for controlling the plurality of memory elements which store failure data outputted from the failure data compression means respectively to determine a memory element in which a failure data is to be stored.

In a preferred specific embodiment, the failure data compression means comprises: memory means having a pipeline structure for transmitting a row and column address signals of an address at which a failure has occurred, a failure data, and a failure store flag representing an occurrence of failure to memory means at the subsequent stage by synchronizing them with an operating clock from the clock generating part; a plurality of address comparators each of which compares the address signal stored in the memory means at the last stage of the memory means having a pipeline structure with the address signal stored in corresponding one of the memory means at the preceding stages to the last stage of the memory means having a pipeline structure; an OR gate for operating a logical OR of failure data each having the same address each time when each of the address comparators detects the same address as that stored in the memory means at the last stage of the memory means having a pipeline structure; and gates for inhibiting the failure store flag stored in the memory means at the stage of the memory means having a pipeline structure where the same address has been detected from being transmitted to the subsequent stage.

The data distribution control part comprises: row address memory means for storing a row address signal among address signals sent together with failure data each time when the clock generating part outputs a clock; a plurality of flag registers provided one for one of the memory elements which store failure data and controlled to be in waiting state by a complete signal outputted from each of the memory elements each time when the memory elements end their writing operations; a plurality of gates only one of which is always controlled to be in enable state according to the plurality of flag registers all of which are in waiting state and the degree of the priority thereof; row address registers supplied with a clock from the clock generating part through the gate in enable state among the plurality of gates, and for storing the row address signal; a plurality of address comparators for comparing the row addresses stored in the row address registers with the row address stored in the row address memory means; and gates for giving a write control signal to either one of the plurality of memory elements depending upon the coincidence outputs from the plurality of address comparators and the failure store flag outputted from the failure data compression means.

In addition, the memory part constituted by the plurality of memory elements each needing a storage maintaining operation comprises: a row address register for storing row address at an address where a failure has occurred; a first-in first-out memory for storing a column address at an address where a failure has occurred and a failure data; a control part for controlling to give, in response to a write control signal outputted from the data distribution control part, a data acquisition or storing command to the row address register and the first-in first-out memory as well as controlling a counter for storing the number of data in the first-in first-out memory; and a controller for controlling to access the memory part in response to the row address stored in the row address register and the column address stored in the first-in first-out memory to write the failure data stored in the first-in first-out memory.

Further, the plurality of memory elements each needing a storage maintaining operation in the memory part are constituted by DRAMs.

According to the present invention, if a plurality of failure data are detected at the same address in close test cycles, the failure data compression means operates to compress the plurality of the detected failure informations to one writing information which can write at one time. Therefore, writing operation of failure information in the failure analysis memory becomes only one time.

As a result, in accordance with the present invention, even if failure data are detected many times at the same address in close test cycles, the many failure data are compressed to one writing data which can write at one time, and hence the frequency of writing of failure data in the failure analysis memory can be reduced. As a result, the number of interleaving the failure analysis memory need not be increased, resulting in an advantage that the scale of the failure analysis memory can be made small.

BRIEF DESCRIPTION OF THE DRAWINGS

FIG. 8 is a diagram for explaining a relationship between the number of possible failures occurring when a test of an IC memory is performed using the inter-cell interference test pattern shown in FIG. 7 and the failure data compressing operation;

FIG. 9 is a diagram for explaining a relationship between the number of possible failures occurring when a test of an IC memory is performed using the inter-cell interference test pattern shown in FIG. 7, the time duration of occurrence of the failures, and the number of failures after compressed;

DESCRIPTION OF THE PREFERRED EMBODIMENTS

Figure 1:
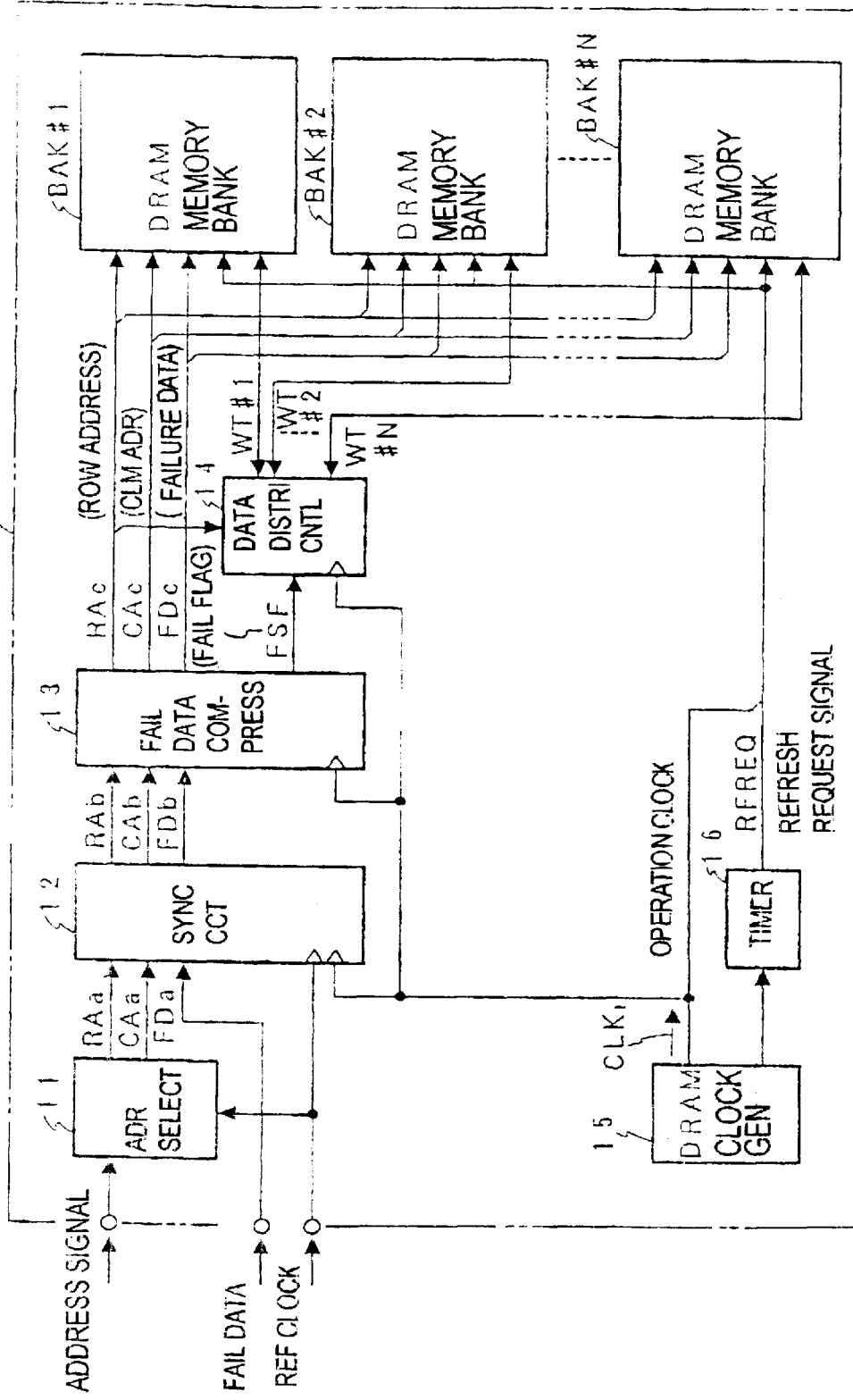
FIG. 1 is a block diagram generally showing the entire construction of a failure analysis memory used in an embodiment of the memory testing apparatus according to the present invention.

FIG. 1 shows the entire construction of a failure analysis memory FM used in the memory testing apparatus according to the present invention. The illustrated failure analysis memory FM includes a plurality (N) of memory bank parts BAK#1–BAK#n of DRAMs (where N is an integer equal to or greater than two), and a DRAM clock generating part 15 for generating a clock for operating DRAMs in the failure analysis memory FM. Each of the DRAM memory bank parts comprises a plurality of DRAM memory parts in each of which a failure data is written.

Figure 10:
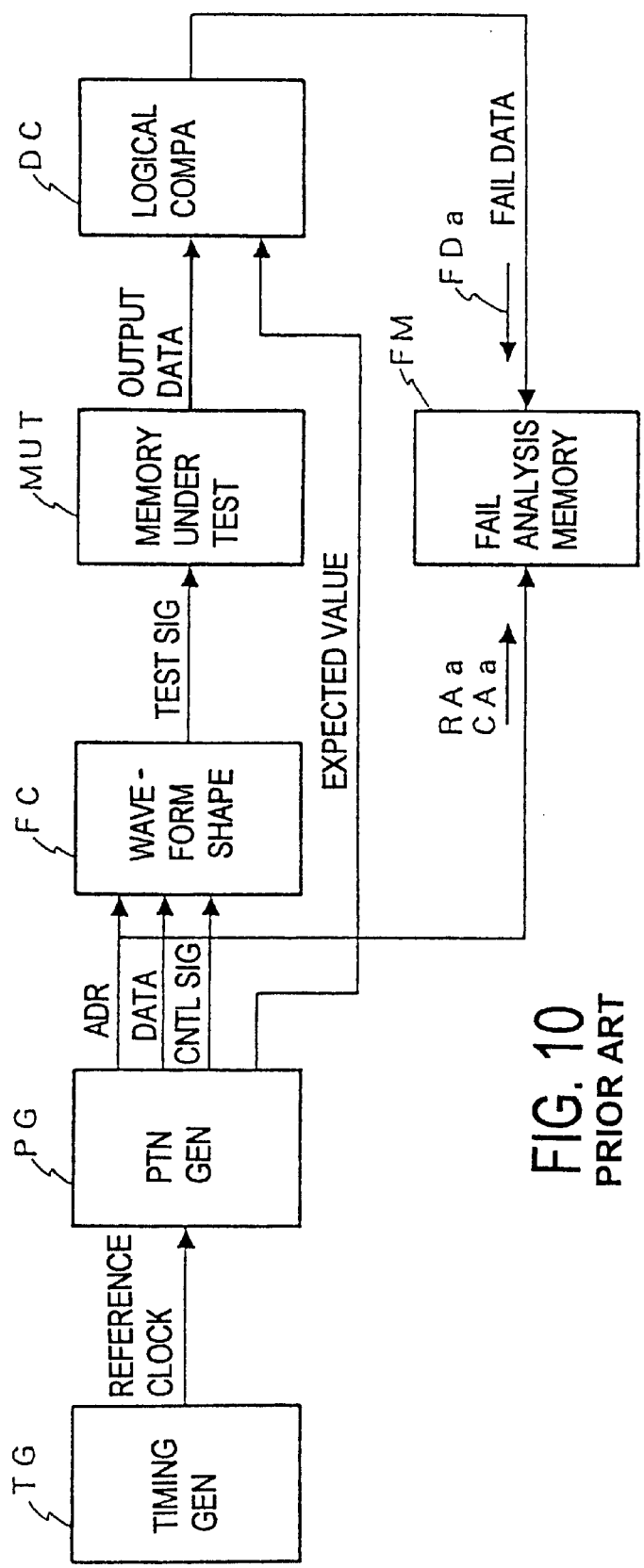
FIG. 10 is a block diagram for explaining the entire construction of an example of the conventional memory testing apparatus.
Figure 11:
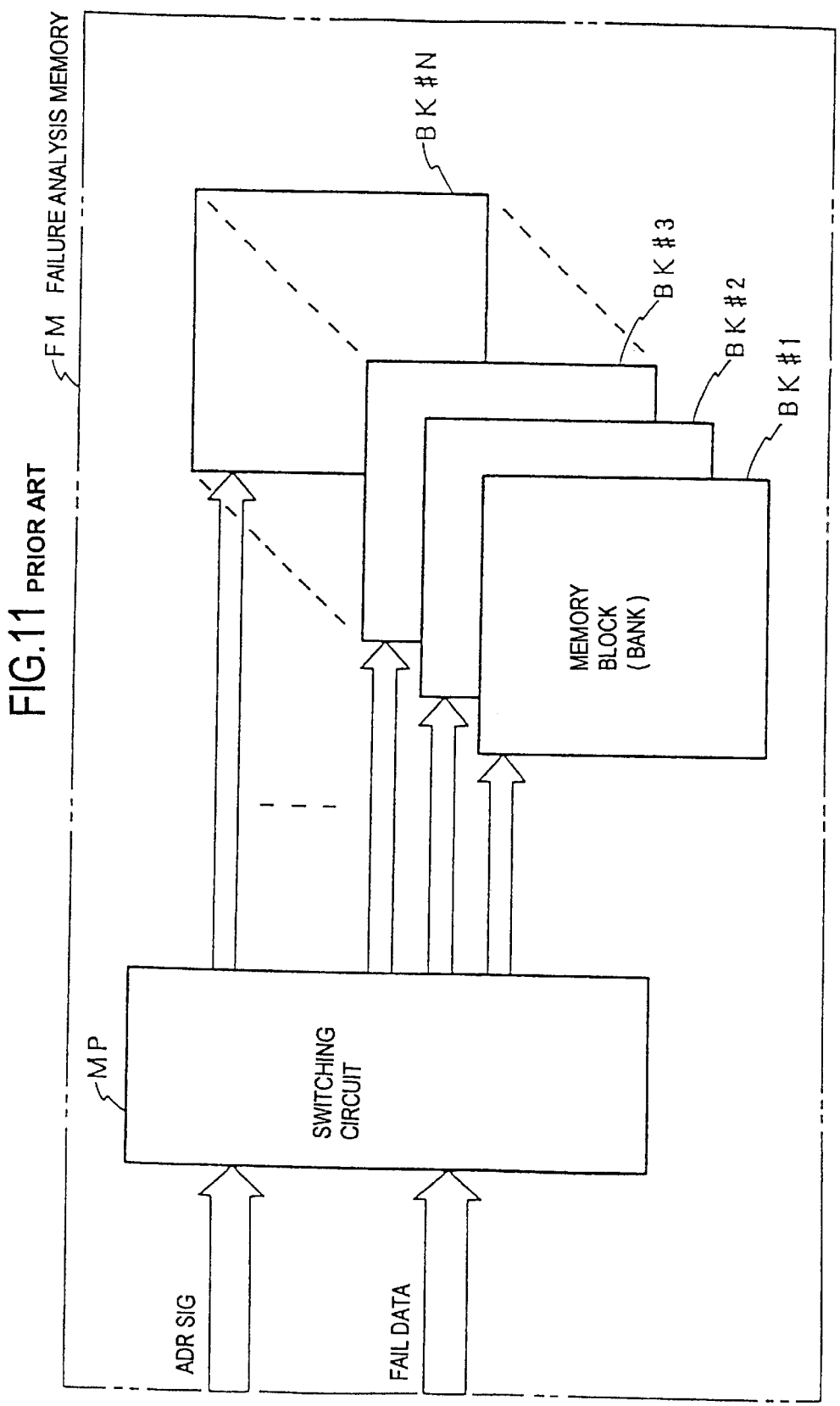
FIG. 11 is a block diagram showing a specific example of the failure analysis memory using a DRAM.
Figure 12:
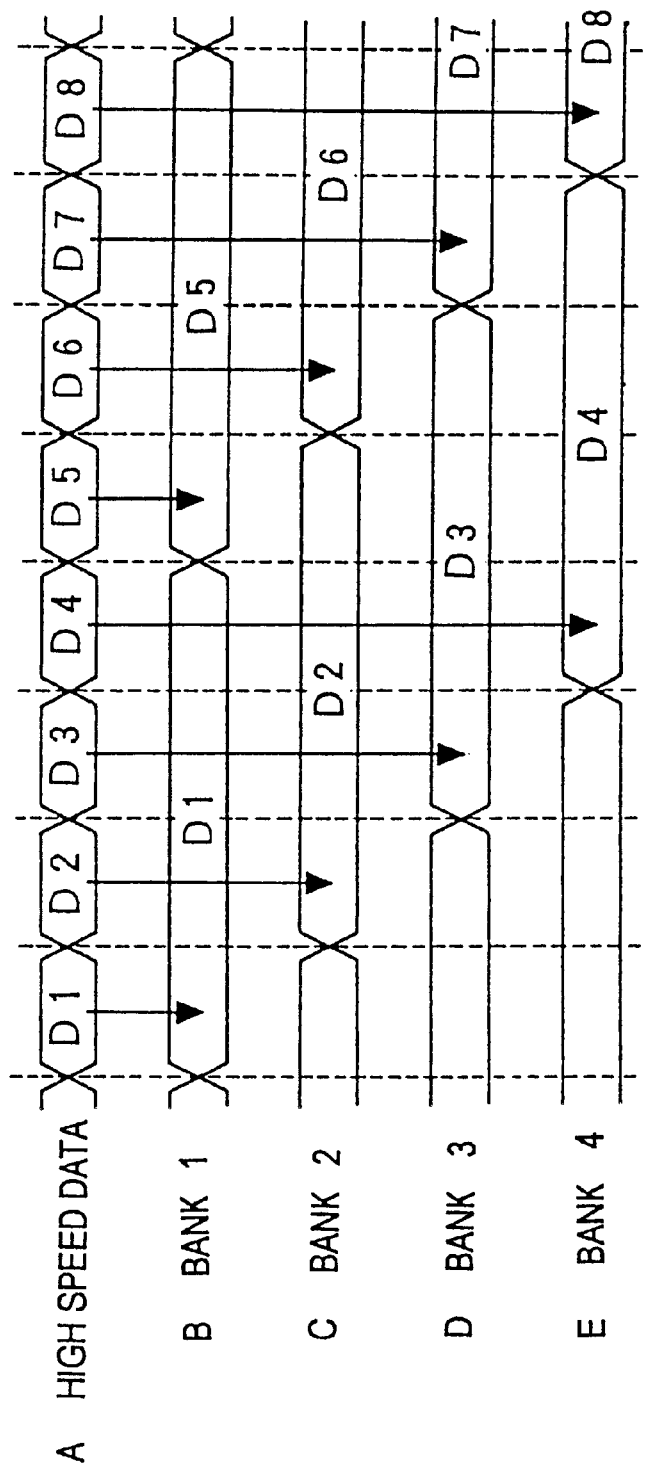
FIG. 12 is a waveform diagram for explaining an operation of the failure analysis memory shown in FIG. 11.

The failure analysis memory FM further includes an address selection part 11 which generates, in response to address signals (a row address signal and a column address signal) in synchronism with a reference clock from the timing generator TG (see FIG. 10) and supplied from the pattern generator PG (see FIG. 10), a row address signal RAa and a column address signal CAa corresponding to the arrangement of row addresses and column addresses of each of the DRAM memory bank parts BAK#1 to BAK#N, a synchronizing circuit part 12 which converts the row address signal RAa and the column address signal CAa from this address selection part 11 as well as a failure data signal FDa in synchronism with the reference clock from the timing generator and supplied from the logical comparator DC (see FIG. 10) into a row address signal RAb and a column address signal CAb in synchronism with a clock $CLK_1$ from the DRAM clock generating part 15 as well as a failure data signal FDb, a failure data compression part 13 which reduces to one time writing operation of a plurality of failure data signals generated from the same address in close test cycles in the DRAM memory bank parts BAK#1–BAK#N, and a data distribution control part 14 for controlling in which DRAM memory bank part a failure data signal to be distributed to each of the DRAM memory bank parts BAK#1–BAK#N is stored.

As was already described, a DRAM needs to undergo a refresh operation (storage retaining operation) at regular intervals in order to maintain the stored contents therein. For this reason, it is impossible to operate DRAMs by the reference clock from the timing generator, and hence the DRAM clock generating part 15 is provided in the failure analysis memory FM as described above. A clock from the DRAM clock generating part 15 is also supplied to a timer 16 which, in turn, supplies a refresh request signal RFREQ to each of the DRAM memory bank parts BAK#1–BAK#N at regular intervals, thereby to refresh the plural DRAM memory parts of each of the DRAM memory bank parts.

The present invention is characterized in that the failure analysis memory FM is arranged such that a failure data FDc compressed by the failure data compression part 13 is written in one of the DRAM memory bank parts BAK#1–BAK#N determined by the data distribution control part 14.

As stated above, the address selection part 11 formats (rearranges) address signals (a row address signal and a column address signal) from the pattern generator PG so that they match with the arrangement of row addresses and column addresses of the plural DRAM memory parts of each of the DRAM memory bank parts BAK#1–BAK#N. In addition, the row address signal RAa and the column address signal CAa which are outputs from the address selection part 11 and the failure data signal FDa from the logical comparator DC are signals in synchronism with the reference clock supplied from the timing generator TG. The synchronizing circuit part 12 converts these signals into the row address signal RAb and the column address signal CAb as well as the failure data signal FDb all of which are in synchronism with an operation or operating clock from the DRAM clock generating part 15.

The failure data compression part 13 carries out a transducing operation in which the failure data compression part 13 compresses, in case that the same address is detected a plurality of times in close test cycles and data read out of this address does not coincide with an expected value data and hence a failure data is generated as many times, these failure data into one failure data by performing a logical OR operation of these failure data in bit by bit basis. As a result, the writing process is completed by only one writing operation of the failure data.

The data distribution control part 14 controls in which DRAM memory bank part a failure data to be distributed to each of the DRAM memory bank parts BAK#1–BAK#N is stored by transmitting therefrom and receiving therein each of writing control signals WT#1–WT#N to and from each of the DRAM memory bank parts BAK#1–BAK#N. The plural DRAM memory parts of each of the DRAM memory bank parts store the failure data on the basis of the control of the data distribution control part 14.

Further, in FIG. 1, the suffixes "a", "b", and "c" of the row address signals RAa, RAb and RAc, the column address signals CAa, CAb, and CAc, and the failure data signals FDa, FDb, and FDc represent timings thereof, respectively, and hence the difference in timing is indicated by such suffixes.

Figure 2:
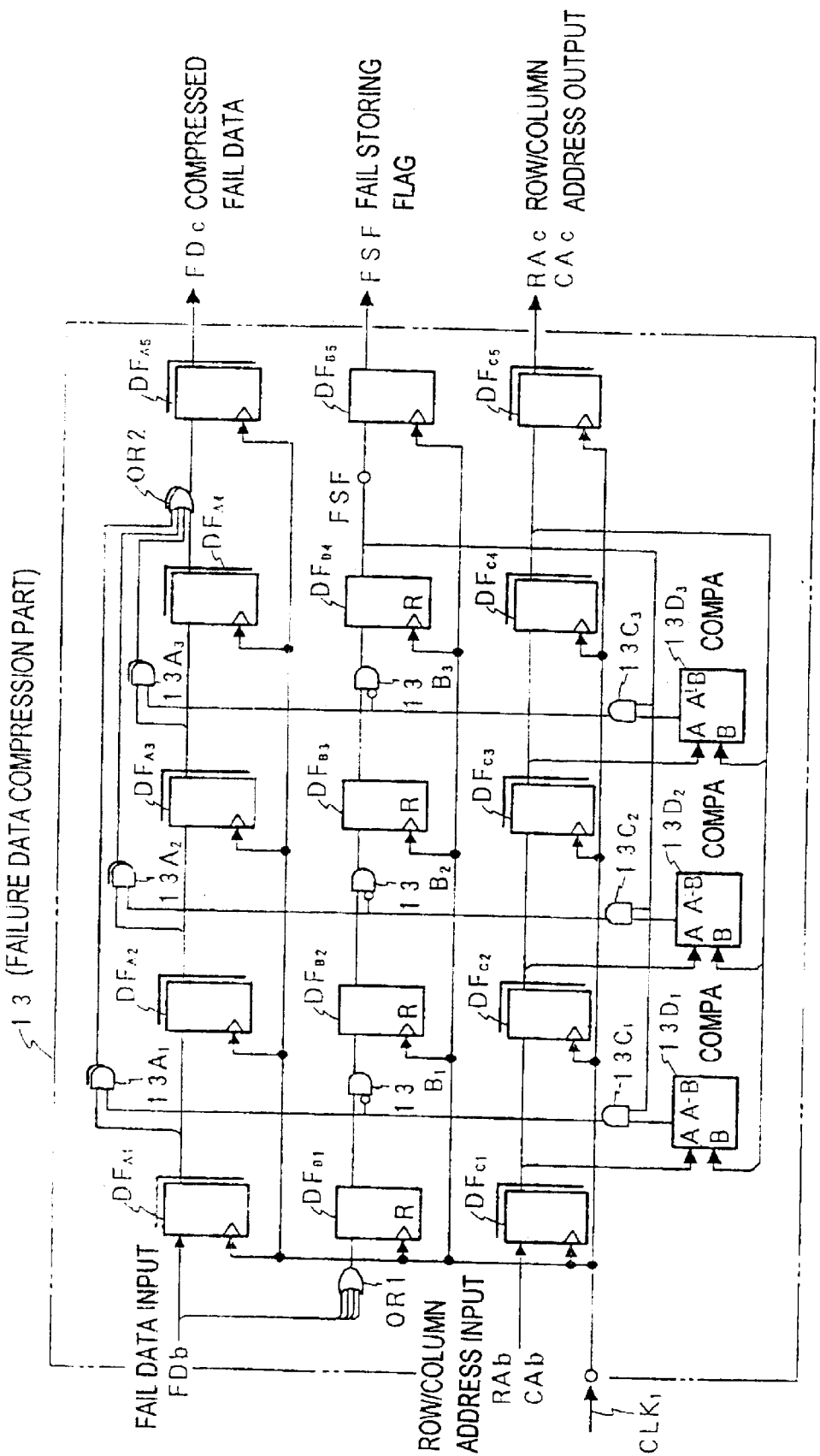
FIG. 2 is a block diagram showing a specific example of the failure data compression part used in the failure analysis memory shown in FIG. 1.

FIG. 2 shows a specific embodiment of the failure data compression part 13. The illustrated failure data compression part 13 is a case in which the failure data compression part 13 compresses four failure data generated from the same address in close four test cycles. The failure data compression part 13 comprises a group of D-type flip-flops $DF_{A1}$–$DF_{A5}$ having a pipeline structure for shifting a failure data, a group of flip-flops $DF_{B1}$–$DF_{B5}$ having a pipeline structure for transmitting a failure store flag FSF representing the presence or absence of failure information, and a group of flip-flops $DF_{C1}$–$DF_{C5}$ having a pipeline structure for sequentially shifting the row address RAb and the column address CAb.

Each of failure data normally has a bit structure of plural bits which comprises a logical "1" representing the presence of a failure and one or plural logical "0"s each representing the absence of a failure. The above group of D-type flip-flops $DF_{A1}$–$DF_{A5}$ having a pipeline structure shifts data over the whole bit width of a failure data to the subsequent stages in stage by stage manner in synchronism with the operating clock $CLK_1$ outputted from the DRAM clock generating part 15.

The above group of flip-flops $DF_{B1}$–$DF_{B5}$ having pipeline structure shifts the failure store flag FSF representing the presence/absence of failure information to the subsequent stages in stage by stage manner in synchronism with the operating clock $CLK_1$ outputted from the DRAM clock generating part 1. That is, in case that failure data in close four test cycles are inputted into the group of flip-flops $DF_{B1}$–$DF_{B5}$ through an OR gate OR1, when there is a bit of logical "1" therein, it detects the presence of failure information and defines the detected data of logical "1" as a failure store flag FSF which is, in turn, shifted sequentially to the subsequent stages in stage by stage manner in synchronism with the clock $CLK_1$.

The above groups of flip-flops $DF_{C1}$–$DF_{C5}$ having a pipeline structure sequentially shifts the row address RAb and the column address CAb to the subsequent stages in stage by stage manner in synchronism with the clock $CLK_1$. The row address RAb and the column address CAb sequentially shifted stage by stage by the groups of flip-flops $DF_{C1}$–$DF_{C5}$ are compared in address comparators $13D_1$, $13D_2$, and $13D_3$ such manner that in the address comparator $13D_1$, the row address RAb and the column address CAb stored in the first flip-flop $DF_{C1}$ are compared with the row address RAb and the column address CAb stored in the fourth flip-flop $DF_{C4}$, in the address comparator $13D_2$, the row address RAb and the column address CAb stored in the second flip-flop $DF_{C2}$ are compared with the row address RAb and the column address CAb stored in the fourth flip-flop $DF_{C4}$, and in the address comparator $13D_3$, the row address RAb and the column address CAb stored in the third flip-flop $DF_{C3}$ are compared with the row address RAb and the column address CAb stored in the fourth flip-flop $DF_{C4}$. If the address comparators $13D_1$–$13D_3$ indicate that both addresses coincide with each other and at the same time the failure store flag FSF stored in the flip-flop $DF_{B4}$ is logical "1", corresponding gates (AND) $13C_1$–$13C_3$ output logical "1". When each of the gates $13C_1$, $13C_2$ and $13C_3$ outputs logical "1", corresponding another gates (AND) $13A_1$, $13A_2$ and $13A_3$ are controlled to be enabled (open). Consequently, a failure data stored in each of the flip-flops $DF_{A1}$, $DF_{A2}$ and $DF_{A3}$ is supplied to an OR gate OR2 where the three failure data are ORed, and the result of this OR operation by the OR gate OR2 is stored in the flip-flop $DF_{A5}$. Thus, the failure data written four times and stored in the D-type flip-flops $DF_{A1}$–$DF_{A4}$ are compressed to one failure data which can be written in the failure analysis memory by one writing operation.

While such compressing operation has been performed, gates $13B_1$, $13B_2$ and $13B_3$ are controlled to be disabled (closed), and hence the failure store flag FSF is not shifted to the subsequent stages. As a result, logical "0"s are written in the flip-flops $DF_{B2}$–$DF_{B4}$ and the failure store flag FSF is maintained to be logical "0" during the subsequent three shift operations, and hence writing operation of data in the DRAM memory bank parts BAK#a–BAK#N is inhibited.

As an another example of such compressing operation, if an address signal stored in the flip-flop $DF_{C1}$ coincides with an address signal stored in the flip-flop $DF_{C4}$ and other address signals stored in the flip-flops $DF_{C2}$–$DF_{C3}$ do not coincide with the address signal stored in the flip-flop $DF_{C4}$, for instance, only the gate $13A_1$ is enabled and a failure data stored in the flip-flop $DF_{A1}$ is ORed with a failure data stored in the flip-flop $DF_{A4}$ in the OR gate OR2 so that the result of this OR operation by the OR gate OR2 is stored in the flip-flop $DF_{A5}$. At this time, the failure data stored in the flip-flop $DF_{A1}$ is sent to the flip-flop $DF_{A2}$, but a logical "0" is written in the flip-flop $DF_{B2}$ since the gate $13B_1$ is disabled. Consequently, when the failure data now sent to the flip-flop $DF_{A2}$ will be sent to the flip-flop $DF_{A4}$ at a later time, the failure store flag FSF which will be written in the flip-flop $DF_{B4}$ at that time will be logical "0", and hence writing operation of failure data in the DRAM memory bank parts BAK#1–BAK#N is inhibited. That is, in this example, the failure data written four times are compressed to one failure data which was written in the flip-flop $DF_{A1}$ before three test cycles.

The failure analysis memory FM is generally constructed such that any failure data written therein once is inhibited from being rewritten. For this reason, in the failure analysis memory FM, when a writing operation is carried out, the failure data (multi-bit data) stored in the address in which a new failure data is to be written is once read out thereof and a logical OR of the read-out failure data and the new failure data is operated and thereafter the result of the OR operation is written in that address. Therefore, though not shown in FIG. 2, the OR gate OR2 shown in FIG. 2 is arranged such that the failure information read out of the failure analysis memory is also supplied to the OR gate OR2.

Figure 3:
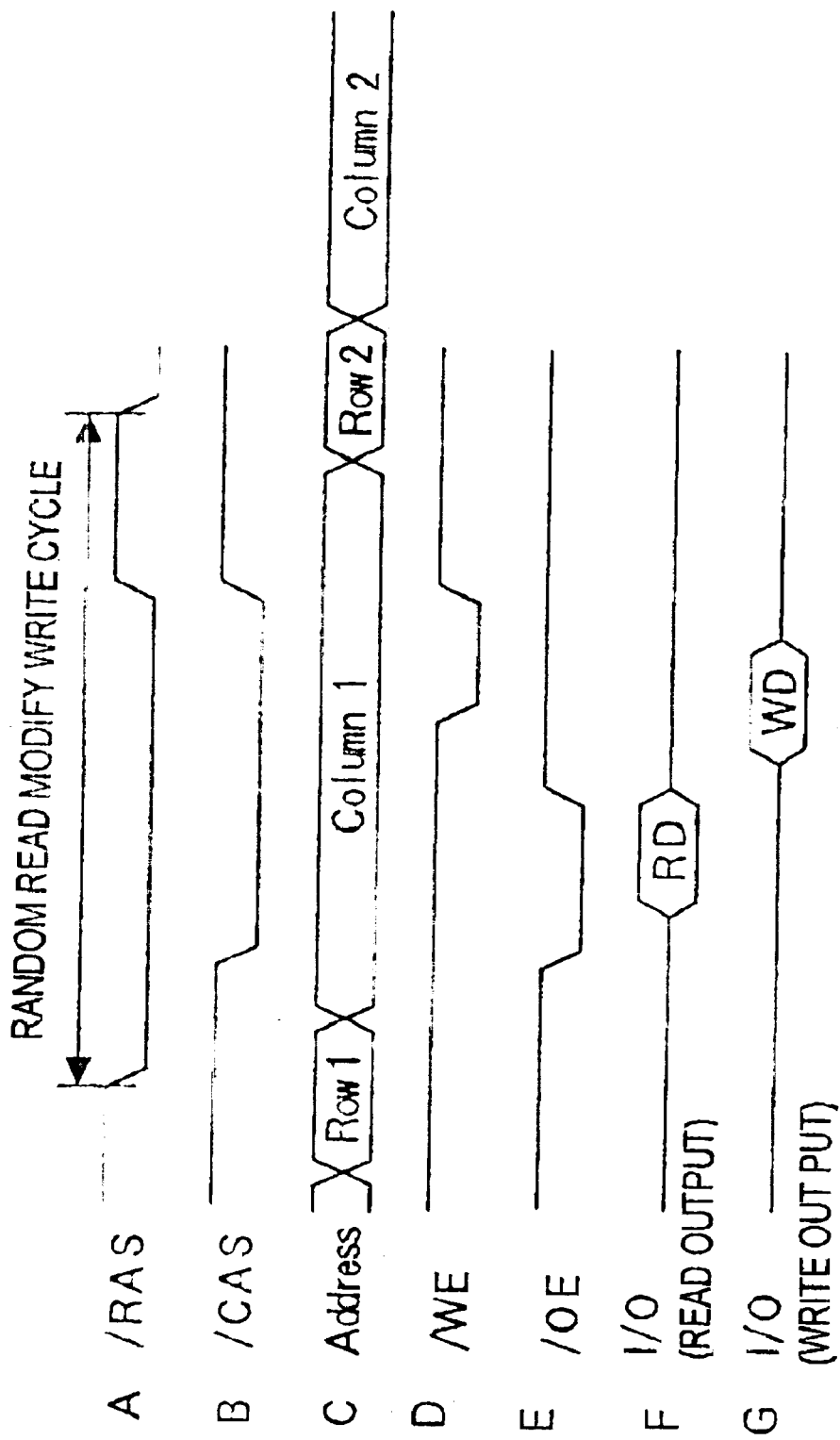
FIG. 3 is a waveform diagram for explaining an example of the method for writing failure data in the failure analysis memory shown in FIG. 1.
Figure 4:
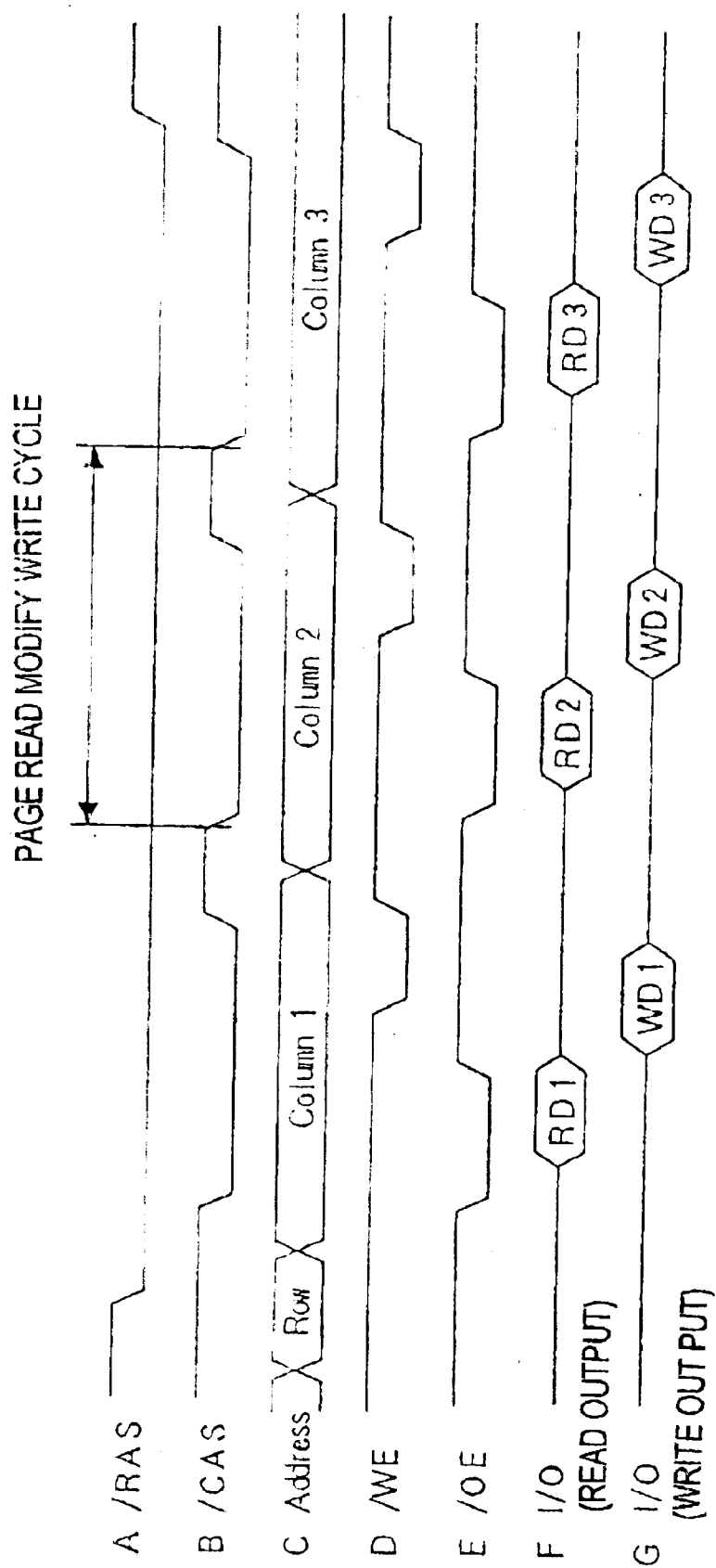
FIG. 4 is a waveform diagram for explaining another example of the method for writing failure data in the failure analysis memory shown in FIG. 1.

An operation for reading a memory before writing a new data therein is commonly called a "read modify write" operation. FIGS. 3 and 4 show timing charts each illustrating such read modify write operation. FIG. 3 shows an example of the operation in the "random access mode" where a row address signal Row and a column address signal Column vary every time.

FIG. 4 shows an example of the operation in the "fast page mode" or "hiper page mode" where a row address signal Row is not inputted every time and a column address signal Column is only inputted every time. In this fast page mode, a high speed (or fast) page read modify write operation can be performed. Therefore, in the present invention, a plurality of failure data having the same row address among the addresses are written in the same DRAM memory bank part by carrying out the fast page mode operation and a plurality of failure data having different row addresses from one another are written in different DRAM memory banks by switching them.

In case there is only one failure data per one row address, the result is that such operation is equivalent to the random access operation shown in FIG. 3.

Figure 5:
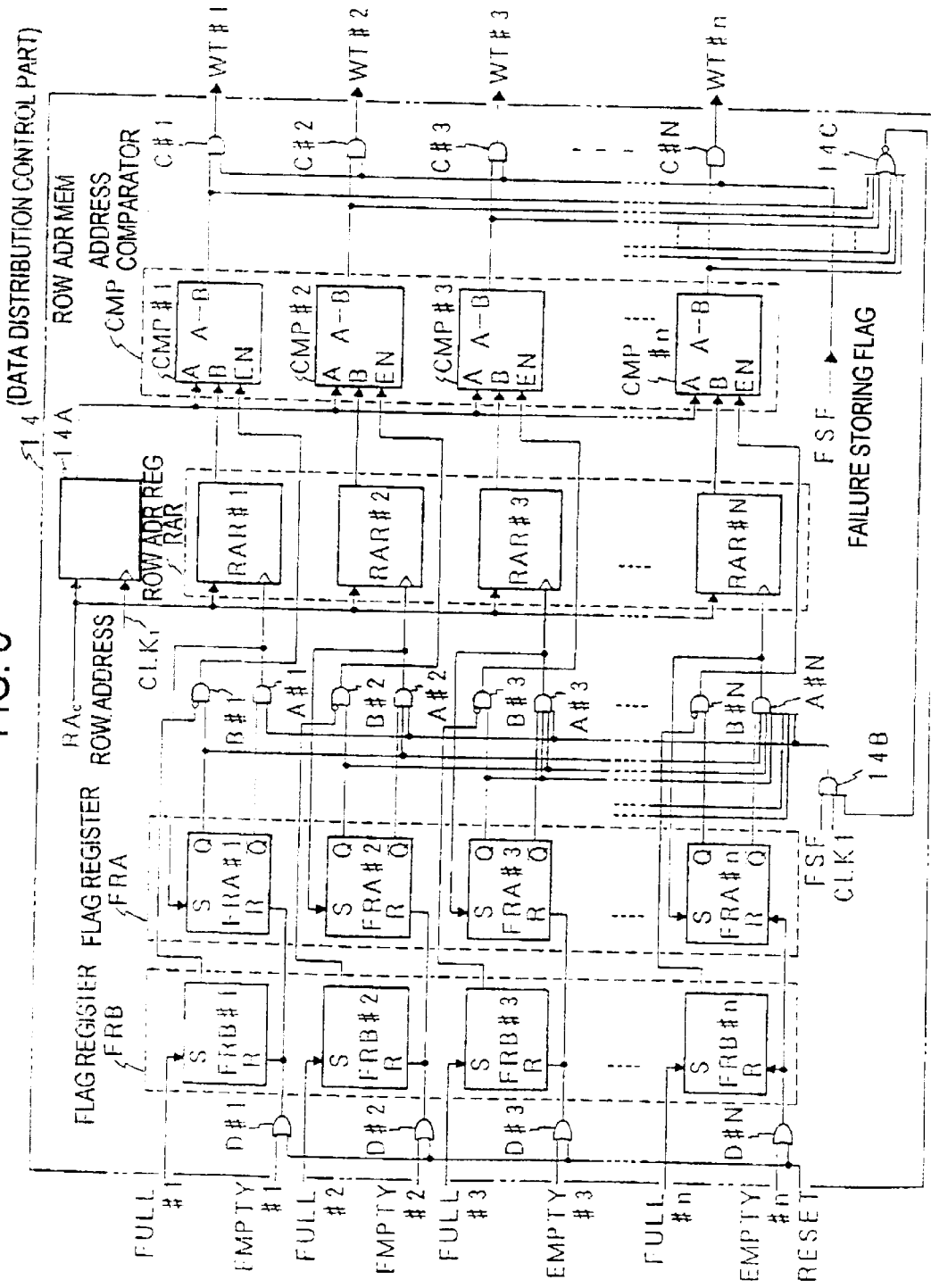
FIG. 5 is a block diagram showing a specific example of the data distribution control part used in the failure analysis memory shown in FIG. 1.

FIG. 5 shows a specific embodiment of the data distribution control part 14 for determining a DRAM memory bank part in which a failure data is to be written. This data distribution control part 14 comprises a group of flag registers FRB, a group of flag registers FRA, a group of gates A#1–A#N, a group of gates B#1–B#N, a group of row address registers RAR, a group of address comparators CMP, a group of gates C#1–C#N for taking out wiring control signals WT#1–WT#N respectively, a row address memory 14A for storing the newest row address inputted thereinto, a gate 14C for detecting a state that writing control signals WT#1–WT#N are outputting thereby controlling a gate 14B to be disabled (closed), and a group of OR gates D#1–D#N each operating a logical OR of a completion signal EMPTY described later and a reset signal to supply the result of the OR operation to respective reset terminals R of the corresponding flag registers of the flag register groups FRB and FRA.

In this data distribution control part 14, a lower # NO. (sharp number) has a higher priority and the operation is started preferentially from #1 side. That is, all of the flag registers FRA#1–FRA#N constituting the flag register group FRA and all of the flag registers FRB#1–FRB#N constituting the flag register group FRB are reset in the initial state by an initialization operation. Accordingly, only the gate A#1 is controlled to be enabled and hence the priority of the first (the highest priority) is given to that gate A#1.

When a failure store flag FSF (logical "1") is outputted from the failure data compression part 13, the gate 14B is enabled, and hence the clock $CLK_1$ is supplied to a clock input terminal of the row. address register RAR#1 and to a set terminal of the flag register FRA#1 via the gate A#1. When the clock $CLK_1$ is supplied to the row address register RAR#1, a row address RAc among failure addresses outputted from the failure data compression part 13 is acquired in this row address register RAR#1. The row address acquired in the row address register RAR#1 is compared with the same row address acquired in the row address memory 14A in the address comparator CMP#1. If there is a coincidence between both row addresses, a logical "1" is outputted from the address comparator CMP#1 to the gate C#1. Since a failure store flag FSF having logical "1" has been already supplied to the gate C#1, the gate C#1 outputs a writing control signal WT#1 having logical "1". This writing control signal WT#1 is supplied to the DRAM memory bank part BAK#1 shown in FIG. 1 as a control signal for writing a failure data therein.

When the writing operation of the failure data in the DRAM memory bank part BAK#1 is completed, a completion or end signal EMPTY#1 is returned to the data distribution control part 14 from the DRAM bank part BAK#1. When the completion signal EMPTY#1 is returned to the data distribution control part 14, the flag register FRA#1 is reset so that the gate A#1 is returned to its enable state again (when the gate A#1 is in its disable state, the gate A#2 is controlled to be in its enable state).

Therefore, when the failure store flag FSF is inverted next time to logical "1", a row address signal at an address where a failure has occurred is stored again in the row address register RAR#1 and then a writing control signal WT#1 is outputted again. In such a way, in the state that a failure occurs at a timing after the processing time interval in the DRAM bank part BAK#1 ends, failure data are concentrated into a written in the DRAM memory bank part BAK#1.

On the other hand, in the case that failures occur at different addresses in close test cycles and that the subsequent failure occurs in the state that the writing operation of the previous failure is not yet completed in the DRAM memory bank part BAK#1, since the gate A#2 is enabled in this case, the clock $CLK_1$ is given to the row address register RAR#2 via this gate A#2, and the row address signal at the address where the failure has occurred is acquired in the row address register RAR#2. Since, at this time, the same row address signal is also acquired in the row address memory 14A, the address comparator CMP#2 outputs a coincidence signal of logical "1" and the gate C#2 outputs a writing control signal WT#2. In addition, in case a next failure occurs at a different address while the memory bank part BAK#1 and the DRAM memory bank BAK#2 are processing the respective write operations, the gate C#3 outputs a writing control signal WT#3 and the failure data is written in the DRAM memory bank part BAK#3. In such a way, writing of failure data in the low speed DRAM memory bank parts BAK is carried out by means of so called interleave operation.

Figure 13:
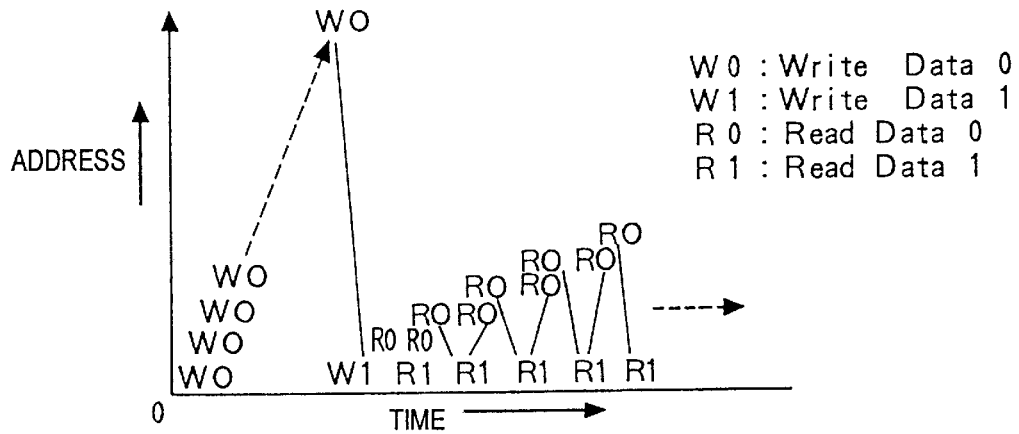
FIG. 13 is a diagram for explaining an example of the test pattern in the conventional inter-cell interference test used in testing an IC memory.
Figure 14:
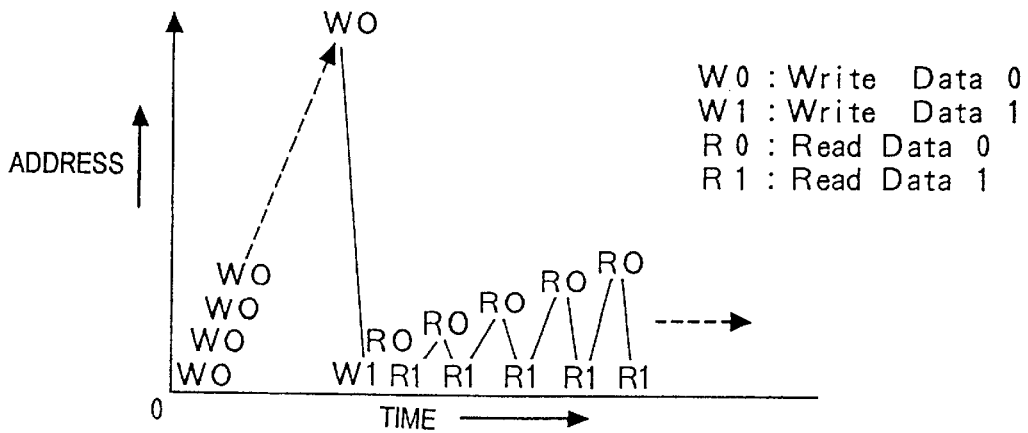
FIG. 14 is a diagram for explaining an another example of the test pattern in the conventional inter-cell interference.
Figure 15:
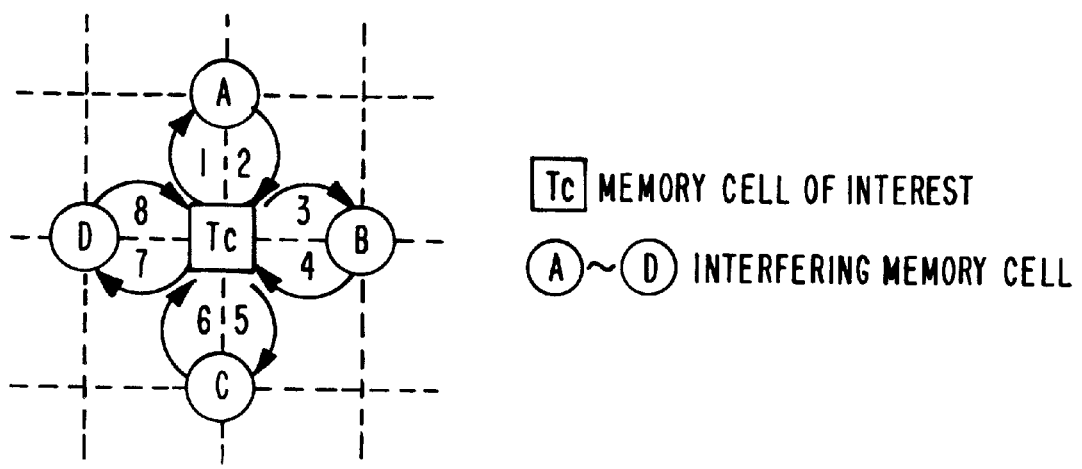
FIG. 15 is a diagram for explaining a still another example of the test pattern in the conventional inter-cell interference test used in testing an IC memory.

Actually, there are few cases that failures occur at different addresses in close test cycles, i.e, no failure occurs or very small number of failures occur in the different addresses in close test cycles. However, when an inter-cell interference test pattern is implemented as shown in FIGS. 13 to 15, failures occur in close test cycles in case a memory cell of interest is defective (a failure cell). When failures occur at the same address, the failure data are compressed by the failure data compression part 13 shown in FIG. 2. Therefore, the same address cannot be consecutively given as the failure address. In practice, the rate of occurrence of failures is high at the addresses having the same row address and different column addresses.

When the same row address is given to the data distribution control part 14 as a failure row address, an address comparator, for example, CMP#1 keeps outputting a coincidence signal having logical "1". Consequently, while the same row address is consecutively inputted, the gate C#1 keeps outputting the writing control signal WT#1. Therefore, the failure data generated at addresses having the same row address and different column addresses are written in the same DRAM memory bank part, for example, DRAM memory bank part BAK#1.

If the number of failure data to be written in the DRAM memory bank part BAK#1 exceeds a certain number, there is possibility that a buffer provided in the DRAM memory bank part BAK#1 is overflown. In this case, the overflown DRAM memory bank part BAK#1 outputs a full signal FULL#1 so that the write operation into the DRAM memory bank part BAK#1 is interrupted. That is, in this state, the flag register FRB#1 is set by the full signal FULL#1, and hence an enable signal being supplied to the address comparator CMP#1 is inverted from logical "1" to logical "0". Consequently, the output of the address comparator CMP#1 is inverted to logical "0", and hence the gate C#1 outputs a logical "0" and the writing control signal WT#1 falls down to logical "0".

On the other hand, at the same time when the output of the address comparator CMP#1 falls down to logical 0, the gate 14C outputs a logical "1" to control the gate 14B to be opened. At this time, the gate A#1 is closed, and instead, the gate A#2 is controlled to be opened. Therefore, a row address being supplied next is stored in the row address register RAR#2. At the same time, the same row address signal is also stored in the row address memory 14A in synchronism with the clock $CLK_1$. Therefore, since the same two addresses are supplied to the address comparator CMP#2, the address comparator CMP#2 outputs a logical "1", and hence the gate C#2 outputs a writing control signal WT#2.

When the DRAM memory bank part BAK#1 completes a writing process during the time period until the gate C#2 outputs the writing control signal WT#2 or after the gate C#2 has outputted the writing control signal, the DRAM memory bank part BAK#1 outputs a completion signal EMPTY#1. The flag registers FRA#1 and FRB#1 are reset by this completion signal EMPTY#1 and those flag registers are returned to the state in which those flag registers wait for an input of a failure data.

The operation of the data distribution control part 14 described above will be summarized as follows.
(1) In case failures occur with a period longer than the writing process time in each of the DRAM memory bank part BAK#1–BAK#N and those failures occur in different addresses, all those failure data are written in the DRAM memory bank part BAK#1.
(2) In case failure occur with a period shorter than the writing process time in each of the DRAM memory bank part BAK#1–BAK#N and those failures occur in different addresses, the failure data are written in the DRAM memory bank parts in the order of BAK#1, BAK#2, BAK#3, . . . . In this case, if one or more DRAM memory bank parts have completed their respective writing processes before the data writing in the last DRAM memory bank part BAK#N occurs, the failure data are written in those DRAM memory bank parts which have completed their respective writing processes.
(3) When failures occur in addresses having the same row address and different column addresses, the failure data are written in the same DRAM memory bank part, for example BAK#1.
(4) When failures occur consecutively in the addresses having the same row address, and hence a FIFO memory is filled up, the writing operation to the same DRAM memory bank part is terminated and the DRAM memory bank part is switched to another DRAM memory bank part to which a writing control signal WT#N is outputted.

Figure 6:
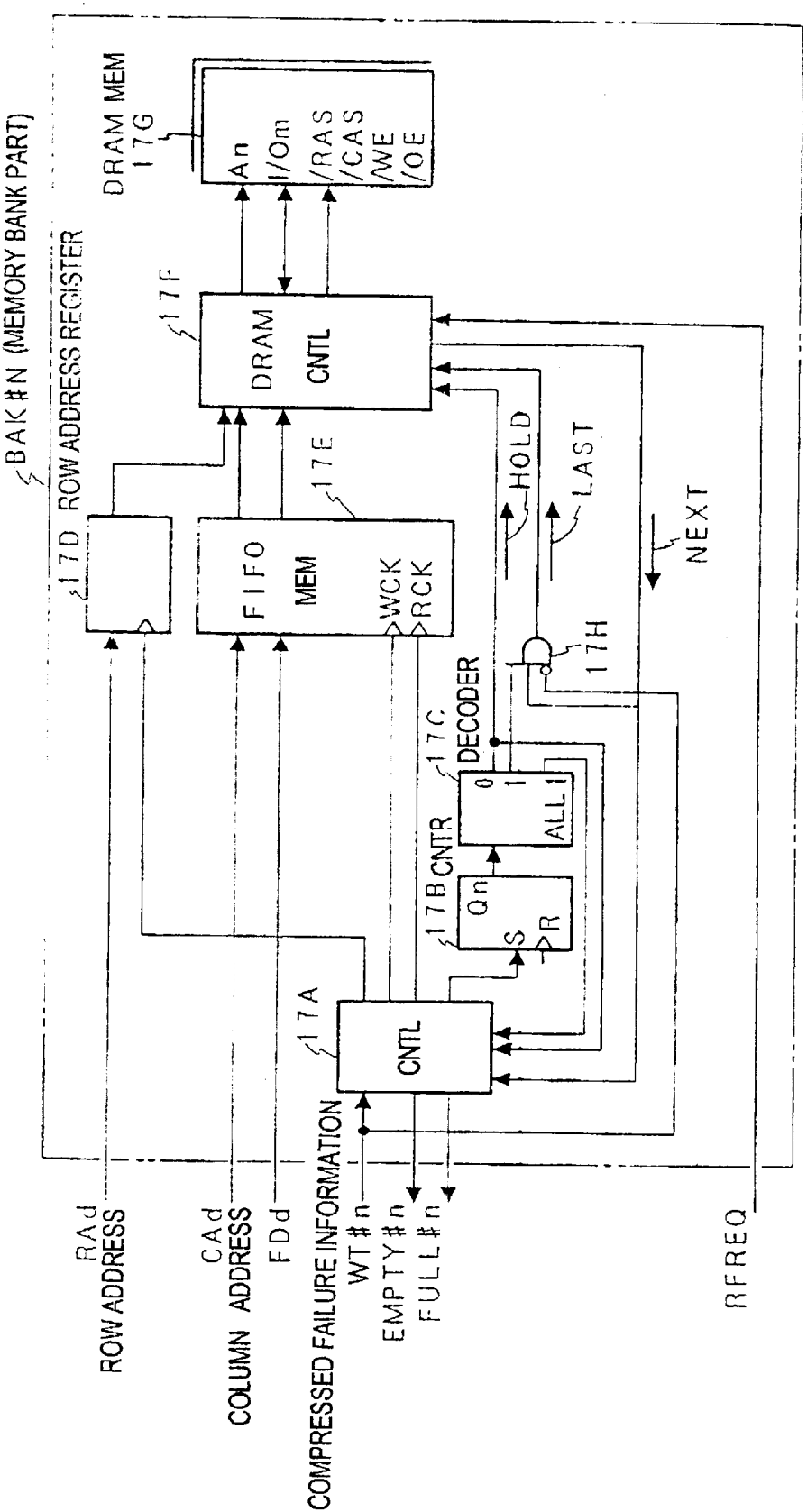
FIG. 6 is a block diagram showing a specific example of the memory bank part used in the failure analysis memory shown in FIG. 1.

FIG. 6 is a block diagram showing concretely the construction of one of the DRAM memory bank parts BAK#1–BAK#N which is taken out by way of example. Since each DRAM memory bank part has the same construction, the DRAM memory bank part BAK#N is exemplarily shown here. The DRAM memory bank part BAK#N comprises a control part 17A, a counter 17B, a decoder 17C, a row address register 17D, a FIFO memory (first-in first-out memory) 17E, a DRAM controller 17F, and a DRAM memory part 17G.

The control part 17A receives a writing control signal WT#N outputted from the data distribution control part 14 shown in FIG. 5 and then supplies a data acquisition or storing command to the row address register 17D and the FIFO memory 17E, and controls the counter 17B to be incremented by one (1).

Upon receiving the data acquisition command from the control part 17A, the row address register 17D acquires a row address RAd of the address in which a failure occurred. At the same time, a writing clock is supplied to a writing clock terminal WCK of the FIFO memory 17E. Then the FIFO memory 17E acquires a column address CAd of the address in which the failure occurred and a compressed failure information FDd outputted from the failure data compression part 13 shown in FIG. 2.

Upon completion of a data writing in the DRAM memory part 17G, the DRAM controller 17F outputs a NEXT signal which is inputted to the control part 17A and a gate 17H. Upon receiving the NEXT signal from the DRAM controller 17F, the control part 17A supplies a read command to the FIFO memory 17F from which one data (a column address and a failure data) is outputted to the DRAM controller 17F. At this time the control part 17A controls the counter 17B to be decremented by 1. When the value of the counter 17B returns to zero, a HOLD signal outputted from the decoder 17C becomes logical "1". Each time the HOLD signal is inverted to logical "1", the control part 17A outputs a completion signal EMPTY#N. The counter 17B eventually manages the number of data stored in the FIFO memory 17E.

In the state that the HOLD signal is logical "1", a timing of data writing into the DRAM memory part 17G is not generated by the DRAM controller 17F. When a refresh request signal RFREQ is inverted to logical "1", the DRAM controller 17F generates and outputs a timing of refresh operation to the DRAM memory part 17G. When the HOLD signal becomes logical "0", the DRAM controller 17F starts a read modify write operation in page mode shown in FIG. 4. Upon storing a failure data into the DRAM memory part, the DRAM controller 17F returns a NEXT signal to the control part 17A. At this time, if the refresh request signal RFREQ is logical "1", the page mode is ended and a timing of a refresh operation is generated. After the refresh operation is completed, if the HOLD signal is logical "0", the page mode operation is restarted and the page mode operation is continued. That is, as for as one or more failure data exist in the FIFO memory 17E, the page mode operation is continued.

When the last failure data is outputted from the FIFO memory 17E, a LAST signal is inverted to logical "1" in synchronism with the NEXT signal. When the LAST signal is inverted to logical "1", the DRAM controller 17F ends the page mode operation. In case only one failure data is stored in the FIFO memory 17E, the DRAM controller 17F immediately outputs the NEXT signal. Therefore, in this case, the LAST signal is also inverted to logical "1" in synchronism with the NEXT signal, and hence the DRAM controller 17F writes one failure data in the DRAM memory part 17G to end its operation. That is, in this case, the DRAM controller 17F generates the timing of the random mode shown in FIG. 3 to end it operation.

The DRAM memory part 17G is constituted by a plurality of DRAMs and has a memory capacity equivalent to that of a memory under test MUT. The operation of the DRAM memory part 17G is controlled by the DRAM controller 17F.

As described above, according to the present invention, since there is provided the failure data compression part 13 shown in FIG. 2 and the data writing is performed in the page mode, there is obtained an effect that the number of DRAM memory bank parts BAK can be reduced as compared with a case in which the failure analysis memory is constructed by simply replacing the high speed SRAMs by DRAMs.

The reason for this will specifically be explained below.

In case the failure analysis memory is constructed by simply replacing high speed SRAMs with DRAMs and the page mode operation is not employed, if any one of the test patterns such as, for example, galloping pattern, ping pong pattern and butterfly pattern can be used, and if the minimum period of failure occurrences is 10 ns and the failure storing operation period of the DRAM memory bank part in a random access considering refresh operations is 160 ns, the number of banks BA is BA=160/10=16. That is, 16 DRAM memory bank parts must be provided.

On the other hand, in case of the data writing in page mode, the minimum required number of DRAM memory bank parts is determined by the relationship between the minimum period of failure occurrences and the failure storing operation period of the DRAM memory bank part considering refresh operations. For example, if the minimum period of failure occurrences is 10 ns and the failure storing operation period of the DRAM memory bank part in the page mode considering refresh operations is 100 ns, the required number of banks BAK is BK=100/'10=10. That is, 10 DRAM memory bank parts may be provided.

Further, in case of the number of banks BK=10, if a test pattern in which address is simply incremented every time by one is used, a failure storing operation in the page mode is possible. However, in case of the inter-cell interference test patterns shown in FIGS. 13 to 15, since the row address is changed as well as the column address in many cases, it is difficult to store all the failure in the DRAM memory bank parts if failures occur consecutively.

Figure 7:
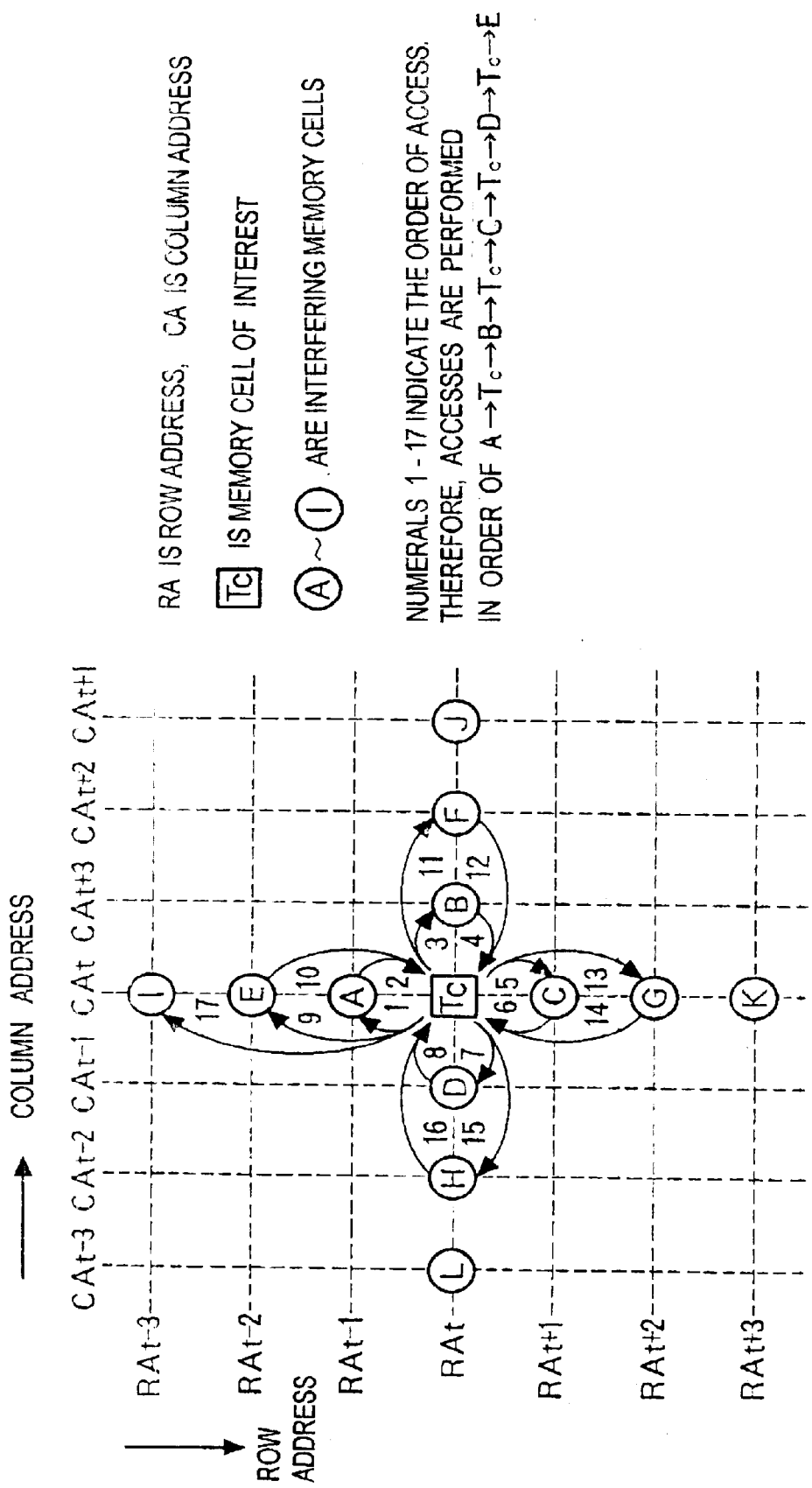
FIG. 7 is a diagram for explaining an example of the test pattern in the inter-cell interference test used in the memory testing apparatus according to the present invention.

For example, if failures occur consecutively in the butterfly pattern shown in FIG. 7, the sequence of the memory accesses is in the order of A—Tc—B—Tc—C—Tc—D—Tc—E . . . .As seen in FIG. 7, the row address takes a plurality of values in close test cycles. That is, it is required that a plurality of failure data must be stored in the DRAM memory bank parts substantially at a time.

In case of the butterfly pattern, four DRAM memory bank parts are required to store the failure data of the addresses in the direction of row addresses RAt±n (n is an integer number). Since eight DRAM memory bank parts are required to store the failure data of the addresses on the row address RAt being accessed in substantially consecutive manner, 12 DRAM memory bank parts in total must be provided in order to cope with this.

In the present invention, this problem is eliminated by adding a function to compress the failure data of the same address in close test cycles, and storing the failure data detected using an inter-cell interference test pattern into the DRAM memory bank parts BAK#1–BAK#N of the minimum required number (10 in this example) is made possible.

The functional effects obtainable by the provision of the failure data compression part 13 will be explained below in detail.

First, the failure data storing operation without the failure data compression part 13 will be explained.

In the butterfly pattern shown in FIG. 7, the reading of memory cells is performed in the sequence of A—Tc—B—Tc—C—Tc—D—Tc—E—Tc—F—Tc—G—Tc—H . . . . Here, the failure data of the cells on the row address RAt can be stored in the page mode operation since the row address is the same. However, the addresses of a cell A on RAt−1, a cell C on RAt+1, a cell E on RAt−2, a cell G on RAt+2, a cell I on RAt−3, . . . have different row addresses from the RAt and each of the row addresses is associated with a failure data. Therefore, the page mode operation is not performed but a random access operation is performed. And hence it takes 160 ns to store a failure data in the DRAM memory bank part.

During a time period until a memory bank becomes ready for receiving a next failure data after performing, in 160 ns, a failure data writing of a failure data of the cell A on RAt−1, memory banks for cells C, E and G must be allocated. That is, if the worst condition that failures occur consecutively is taken into account, at least four DRAM memory bank parts are required to store the failure data in the direction of row addresses RAt±n (n=integer number).

When n is n=1, eight times of memory cell reads are performed. At this time, as shown in FIGS. 8 and 9, six times of memory cell reads are performed for the memory cells on the row address RAt. Since the access rate is constant, if n is n=100, 800 times of memory cell reads are performed and at this time, 600 times of memory cell reads are performed for the memory cells on the row address RAtn. The 600 times of failure store operations must be performed by remaining six memory banks.

The total time duration for failure occurrences is 800×10 ns=8000 ns. Since 600 failure data are distributed and stored in 6 memory banks, 100 failure data are stored in a memory bank. Since the failure storing operation requires 100 ns per failure data in the page mode operation, the total processing time of 100×100 n s=10000 ns is necessary. That is, since the processing time of 10000 ns is necessary for the failure data that must be processed in 8000 ns, the processing capability is not sufficient. In order to make this process possible without providing a failure data compression part 13, two more DRAM memory bank parts must be added to provide total eight memory banks.

On the other hand, in case the failure data compression part 13 is provided, the failure data compression function is applied to four close test cycles according to the embodiment shown in FIG. 2. Therefore, there is no necessity for adding two more DRAM memory bank parts. That is, since the memory cell reads are performed in the sequence of A—Tc—B—Tc—C—Tc . . . , two failure data reads from the memory cell Tc are performed in every four close test cycles. These two failure data can be compressed to a failure data that requires only one failure storing operation by the failure data compression part 13. Therefore, when n is n=1, eight memory cell reads are performed and six memory cell reads of which are for memory cells on the row address RAt. If the failure data compression part 13 is provided, these six failure data are compressed to four failure data as shown in FIGS. 8 and 9.

Similarly, when n is n=100, reading operation of memory cells are performed 800 times and the memory cells at the row address RAt are read 600 times at that time. In this case the number of failure data 600 is compressed to 400. Though the total time duration of failure occurrences is 8000 ns which is constant, but 400 failure data are distributed and stored in six memory banks. As a result, approximately 67 failure data are stored in one memory bank. Since a failure storing operation of one failure data in the page mode requires 100 ns, the processing can be performed by the processing time duration of 67×100 ns=6700 ns.

That is, since the failure data compression part 13 is provided, the failure data that must be processed within a time interval of 8000 ns can be processed within a time interval of 6700 ns and thus the processing is in time.

In the above description, the depth of the FIFO memory in the DRAM memory bank part (the number of data to be stored in the FIFO memory) is not discussed. Because the number of banks is determined depending on the speed (or rate) of data writing in the DRAM even if the depth of the FIFO memory is made large when many failures occur.

In addition, in the inter-cell interference test pattern other than the butterfly pattern, for example, in the galloping pattern shown in FIG. 13, a duplicate access to the same address is performed in every six close test cycles. In the ping pong pattern shown in FIG. 14, a duplicate access to the same address is performed in every four close test cycles. Therefore, it is not necessary to set the number of close test cycles to be compressed by the failure data compression part 13 to a larger number.

As described above, since the failure data compression part 13 is provided, it is not necessary to add two more DRAM memory bank parts. As a result, the failure data in the inter-cell interference pattern can be stored in the DRAM memory bank part having the minimum required number of banks. Therefore, there is obtained an advantage that it is possible to reduce the size of the failure analysis memory by 20%.

Further, it is needless to say that memory elements each needing a storage maintaining operation at regular intervals other than DRAMs may be used as the memory elements in the memory bank part.

What is claimed is:

1. A memory testing apparatus provided with a failure analysis memory for storing failure data resulting from a test of a semiconductor memory under test, said failure analysis memory comprising a memory part comprising a plurality of memory elements to which failure data are distributed by an interleave operation and stored therein, each of said plurality of memory elements having a storage maintaining operation to be executed at regular time intervals, said failure analysis memory comprising:

a clock generating part generating a clock for operating the memory elements of said memory part independent of a reference clock used in testing the semiconductor memory under test;

means for generating a refresh request signal at regular time intervals in order to maintain the stored contents of the memory elements, said means for generating a refresh request signal being supplied with an operating clock from said clock generating part;

an address selection part, supplied with the same address signal as that given to the semiconductor memory under test, taking out a row address signal and a column address signal from the supplied address signal corresponding to an arrangement of row and column addresses of each of said memory elements;

synchronizing means, supplied with a row address signal and a column address signal selected by said address selection part and with a failure data from a logical comparator means, for changing them to a row address signal, a column address signal and a failure data all of which are in synchronism with a clock generated from said clock generating part;

failure data compression means for compressing failure data occurring at the same address in close time to each other in row address signals, column address signals, and the failure data outputted from said synchronization means into one failure data; and a data distribution control part controlling the plurality of memory elements each storing failure data outputted from said failure data compression means to determine one of the memory elements in which a failure data is to be stored.

2. The memory testing apparatus according to claim 1, wherein said failure data compression means comprises:

memory means having a pipeline structure for synchronizing a row address signal and a column address signal in each of which a failure has occurred, a failure data, and a failure store flag representing an occurrence of failure, with an operating clock from said clock generating part and giving them to memory means at the subsequent stage;

a plurality of address comparators each comparing the address signal stored in the memory means at the last state of said pipeline-structured memory means with the address signal stored in corresponding one of the memory means prior to the last state of said pipeline-structured memory means;

an OR gate operating a logical OR of failure data each having the same address each time when each time the same address as that stored in the last stage memory means is detected in each of said address comparator; and a gate for inhibiting said failure store flag stored in the memory means at the stage of said pipeline-structured memory means where the same address has been detected from being given to the subsequent stage.

3. The memory testing apparatus according to claim 1, wherein said data distribution control part comprises:

row address memory means for storing a row address signal in an address signal sent thereto together with failure data each time when said clock generating part outputs a clock;

a plurality of flag registers provided one for one of the memory elements storing failure data and controlled to be in a waiting state by a complete signal outputted from each of said memory elements each time it ends its writing operations;

a plurality of gates only one of said plurality of gates being always controlled to be in enable state in accordance with said plurality of flag registers all being in waiting state and the order of priority;

a row address register, supplied with a clock from said clock generating part through the gate controlled in enable state among said plurality of gates, and storing the row address signal;

a plurality of address comparators each comparing the row addresses stored in said row address register with the row address stored in said row address memory means; and a gate transmitting a write control signal to either one of the plurality of memory elements depending upon the coincident outputs from said plurality of address comparators and the failure store flag outputted from said failure data compression means.

4. The memory testing apparatus according to claim 1, wherein said memory part composed of said plurality of memory elements each needing a storage maintaining operation, comprises:

a row address register storing a row address at an address where a failure has occurred;

a first-in first-out memory storing a column address at an address where failure has occurred and a failure data;

a control part performing a control by which a data acquisition command is given, in response to a write control signal outputted from said data distribution control part to said row address register and said first-in first-out memory as well as control of a counter for storing the number of data in said first-in first-out memory; and a controller performing a control by which said memory part in response to the row address stored in said row address register and the column address stored in said first-in first-out memory, and the failure data stored in said first-in first-out memory is written in the memory part.

5. The memory testing apparatus according to claim 1, wherein said plurality of memory elements each needing a storage maintaining operation in said memory part comprise DRAMs.

* * * * *

UNITED STATES PATENT AND TRADEMARK OFFICE
CERTIFICATE OF CORRECTION

PATENT NO.:   6,173,238
DATED     :   January 9, 2001
INVENTOR(S):  Kenichi FUJISAKI It is certified that errors appears in the above-identified patent and that said Letters Patent is hereby corrected as shown below:

Column 1, line 12: change "Arts" to --Art--.

Column 10, line 42: change "a" to --and--.

Column 13, line 65 and 66: change "—" to --→--, all occurrences.

Column 14, lines 24 and 25: change "—" to --→--, all occurrences.

Column 15, line 4: change "—" to --→--, all occurrences.

Signed and Sealed this

Eighth Day of May, 2001

Attest:

NICHOLAS P. GODICI

Attesting Officer      Acting Director of the United States Patent and Trademark Office